United States Patent
Kang

(10) Patent No.: US 7,688,640 B2
(45) Date of Patent: Mar. 30, 2010

(54) FLASH MEMORY DEVICE AND METHOD FOR DRIVING THE SAME

(75) Inventor: Sang-gu Kang, Suwon-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 177 days.

(21) Appl. No.: 12/051,930

(22) Filed: Mar. 20, 2008

(65) Prior Publication Data

US 2008/0247235 A1    Oct. 9, 2008

(30) Foreign Application Priority Data

Apr. 4, 2007    (KR)    ............... 10-2007-0033370

(51) Int. Cl.
G11C 16/06    (2006.01)
(52) U.S. Cl. .................. 365/185.23; 365/185.22; 365/189.07
(58) Field of Classification Search ............ 365/185.18, 365/185.22, 185.23, 185.24, 185.33, 189.07
See application file for complete search history.

(56) References Cited

U.S. PATENT DOCUMENTS

| | | | |
|---|---|---|---|
| 6,272,586 B1 * | 8/2001 | Roohparvar et al. | ........ 711/103 |
| 6,614,689 B2 * | 9/2003 | Roohparvar | ........... 365/185.22 |
| 6,807,096 B2 * | 10/2004 | Toda | ................... 365/185.03 |
| 6,826,082 B2 * | 11/2004 | Hwang et al. | .......... 365/185.17 |

FOREIGN PATENT DOCUMENTS

| | | |
|---|---|---|
| JP | 11-126489 | 5/1999 |
| JP | 2001-351395 | 12/2001 |
| JP | 2004-152413 | 5/2004 |

* cited by examiner

Primary Examiner—Gene N. Auduong
(74) Attorney, Agent, or Firm—Volentine & Whitt, P.L.L.C.

(57) ABSTRACT

Provided are a flash memory device and a method of driving the same for reading set information and stably storing the read set information in a latch. The method of driving the flash memory device includes applying power to the flash memory device, which includes a memory cell array for storing set information used to set an operating environment of the flash memory device. An initial read operation of the memory cell array is performed to read the set information. The set information read in the initial read operation is stored in a latch. It is determined whether the set information is normally stored in the latch based on set data input to the latch and set data output from the latch.

25 Claims, 10 Drawing Sheets

FLASH MEMORY DEVICE AND METHOD FOR DRIVING THE SAME

CROSS-REFERENCE TO RELATED PATENT APPLICATION

A claim of priority is made to Korean Patent Application No. 10-2007-0033370, filed on Apr. 4, 2007, the subject matter of which is hereby incorporated by reference.

BACKGROUND OF THE INVENTION

1. Field of the Invention

The present invention relates to a flash memory device, and more particularly, to a flash memory device and a method of driving the same in which reliability of set information is determined in an initial read operation.

2. Description of the Related Art

A flash memory device is a nonvolatile memory device capable of electrically erasing and storing data. The flash memory device has power consumption lower than that of a recording medium based on a magnetic disk memory, and an access time as fast as a hard disk of the magnetic disk memory.

The flash memory device may be classified as a NOR type or a NAND type according to the state of connection of cells and bit lines. In a NOR type flash memory device, at least two cell transistors are connected in parallel with a single bit line. The NOR type flash memory device stores data using channel hot electrons and erases data using Fowler-Nordheim (F-N) tunneling. A NAND type flash memory device has at least two cell transistors serially connected to a single bit line. The NAND type flash memory device stores and erases data using F-N tunneling. The NOR type flash memory device has a high operating speed, although the NOR type flash memory device cannot be highly integrated due to high current consumption. The NAND type flash memory device has an advantage in terms of high integration because the NAND type flash memory device uses a cell current lower than that of the NOR type flash memory device.

FIG. 1A is a circuit diagram of memory cells included in a conventional NAND type flash memory device. Referring to FIG. 1A, the conventional NAND type flash memory device includes memory cells M11, M12, M13 and M14, multiple wordlines WL11, WL12, WL13 and WL14, select transistors ST1 and ST2, and a bit line BL. The memory cells M11, M12, M13 and M14 and the select transistors ST1 and ST2 form a string and are connected in series between the bit line BL and a ground voltage VSS. The conventional NAND type flash memory device programs all the memory cells connected to a single wordline at a time because the conventional NAND type flash memory device uses a low cell current.

FIG. 1B is a circuit diagram of memory cells M21 through M26 included in a conventional NOR type flash memory device. Referring to FIG. 1B, the memory cells M21 through M26 are connected between bit lines BL1 and BL2 and a source line CSL. The conventional NOR type flash memory device programs a predetermined number of memory cells through a one-time programming operation because the programming of the conventional NOR type flash device involves high current consumption.

Set information required for a memory operation must be included in a memory device. An electrical fuse (E-fuse) method is a method that stores information in a memory cell, reads the information when a memory chip is operated and turns on/off a corresponding switch to transmit the information. The information stored based on the E-fuse method includes DC trim information, option information, repair information and bad block information for operation of the memory chip. This information is previously stored when a specific region of memory cells is tested.

When power is applied to the memory chip, the set information is read and stored in a latch, and a corresponding switch is turned on/off using the information stored in the latch. As such, various DC levels are set using the information required for the memory operation and column defects and block defects are repaired using the information.

However, DC trim information cannot be used while the set information is read because reading the set information stored based on an E-fuse method includes reading various information items required for the operation of a chip. That is, when power is applied to the flash memory device to read the set information, a DC level, set as a default value, is used to read the set information. Accordingly, the set information is read without using the DC trim information, and thus an error may be generated in the read data, which can result in an error in the set information stored in a latch included in the chip. Furthermore, when the operation of the flash memory device is set using the set information stored in the latch, the operation can be set incorrectly. Therefore, reading information stored based on an E-fuse method and storing the read information in a latch is not reliable.

SUMMARY OF THE INVENTION

The present invention provides a flash memory device and a method of driving the same, to improve reliability of reading set information stored in a memory cell array and storing the read set information in a latch of a chip.

According to an aspect of the present invention, there is provided a method of driving a flash memory device, which includes a memory cell array for storing set information used to set an operating environment of the flash memory device. The method includes applying power to the flash memory device, performing an initial read operation of the memory cell array to read the set information, storing the set information read in the initial read operation in a latch, and determining whether the set information is normally stored in the latch based on set data input to the latch and set data output from the latch.

Determining whether the set information is normally stored in the latch may include determining whether the set data input to the latch is identical to the set data output from the latch.

The method may further include setting the operating environment of the flash memory device using the set information normally stored in the latch.

The method may further include repeating the storing of the set information in the latch when it is determined that the set information is not normally stored in the latch. The method may also include repeating the performing of the initial read operation when it is determined that the set information is not normally stored in the latch.

According to another aspect of the present invention, there is provided a method of driving a flash memory device including applying power to the flash memory device, the flash memory device having a memory cell array for storing set information used to set an operating environment of the flash memory device. The method further includes performing an initial read operation on the memory cell array; performing a first determination operation that judges a status of data read in the initial read operation and determines whether the initial read operation has passed or failed based on the status; storing the data in a latch when the initial read operation is determined to have passed; and performing a second determination operation that determines whether the data is normally stored in the latch based on comparing data input to the latch and data output from the latch.

According to another aspect of the present invention, there is provided a flash memory device including a memory cell array, a latch, a data determination unit and a control logic unit. The memory cell array stores set information used to set an operating environment. The latch stores the set information read from the memory cell array in an initial read operation performed when power is applied to the flash memory device. The data determination unit determines whether the set information is normally stored in the latch using the set information provided to the latch and set information output from the latch. The control logic unit controls operation of the flash memory device according to the determination result of the data determination unit.

According to another aspect of the present invention, there is provided a flash memory device including a memory cell array for storing set information to set an operating environment of the flash memory device, the memory cell array having multiple input/output regions from which data is output according to a single address. A first determination unit receives data corresponding to the set information read in an initial read operation performed when power is applied to the flash memory device and for determining whether the received data is valid. A latch stores data judged to be valid by the first determination unit. A second determination unit determines whether the data is normally stored in the latch based on a comparison of the data provided to the latch and data stored in the latch. A control logic unit controls the operation of the flash memory device according to the determination results of the first and second determination unit.

BRIEF DESCRIPTION OF THE DRAWINGS

The embodiments of the present invention will be described with reference to the attached drawings, in which.

DETAILED DESCRIPTION OF THE EMBODIMENTS

Figure 1A:
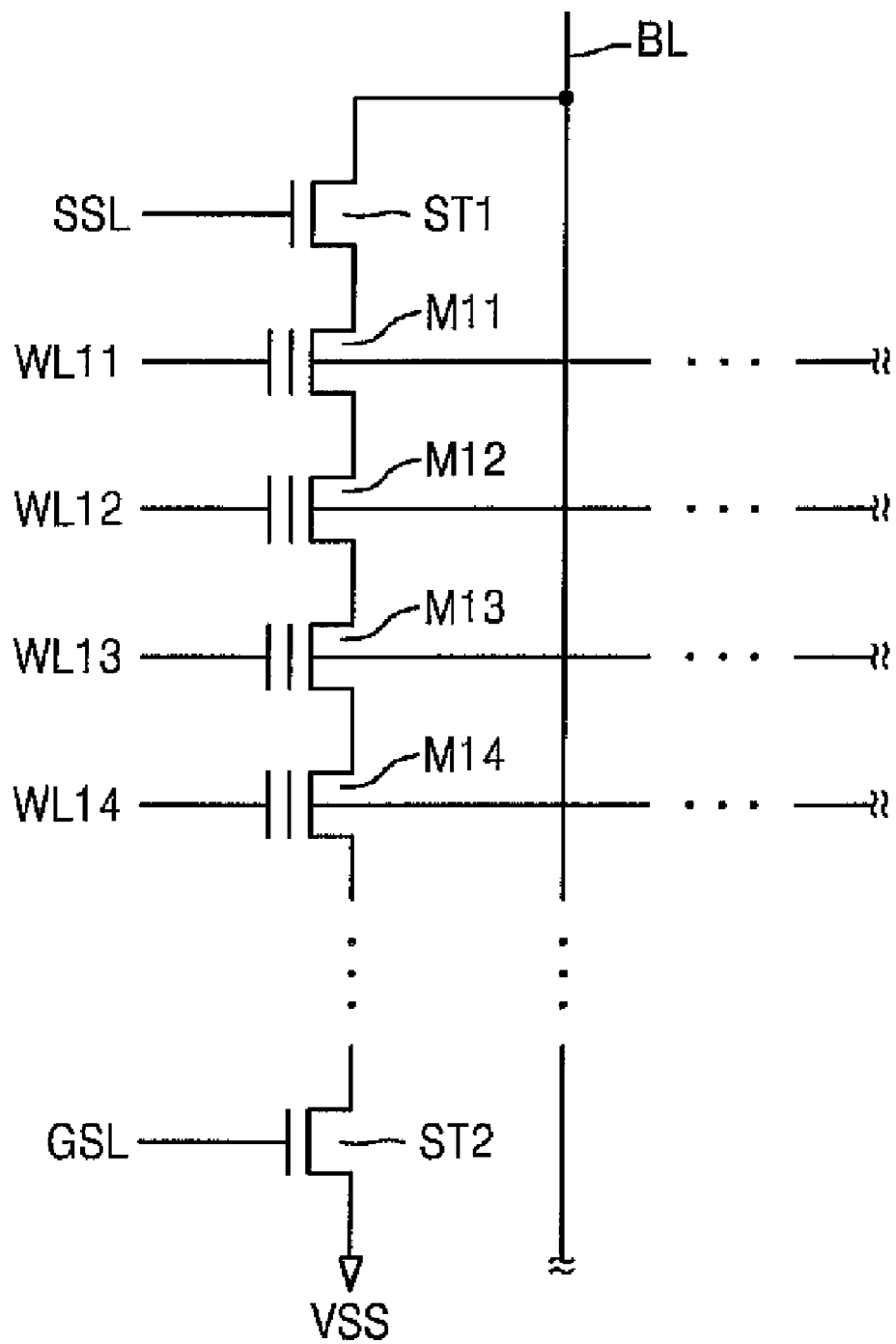
FIG. 1A is a circuit diagram of memory cells included in a conventional NAND type flash memory device.
Figure 1B:
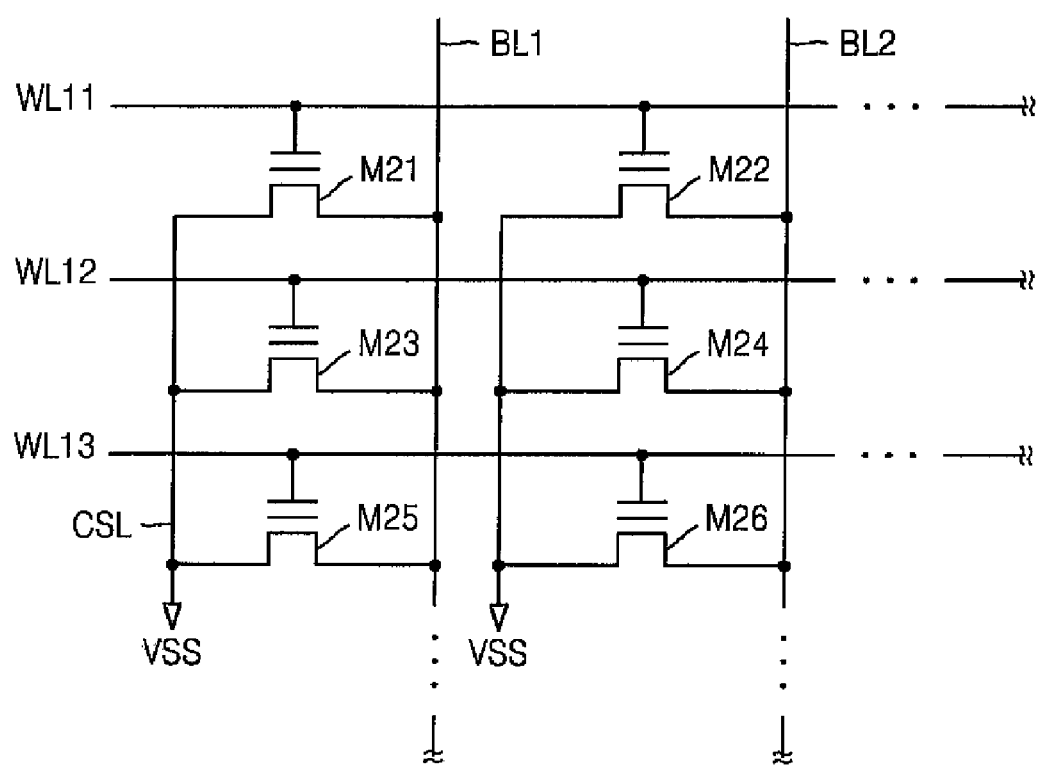
FIG. 1B is a circuit diagram of memory cells included in a conventional NOR type flash memory device.

The present invention will now be described more fully with reference to the accompanying drawings, in which exemplary embodiments of the present invention are shown. The invention may, however, be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements.

Figure 2:
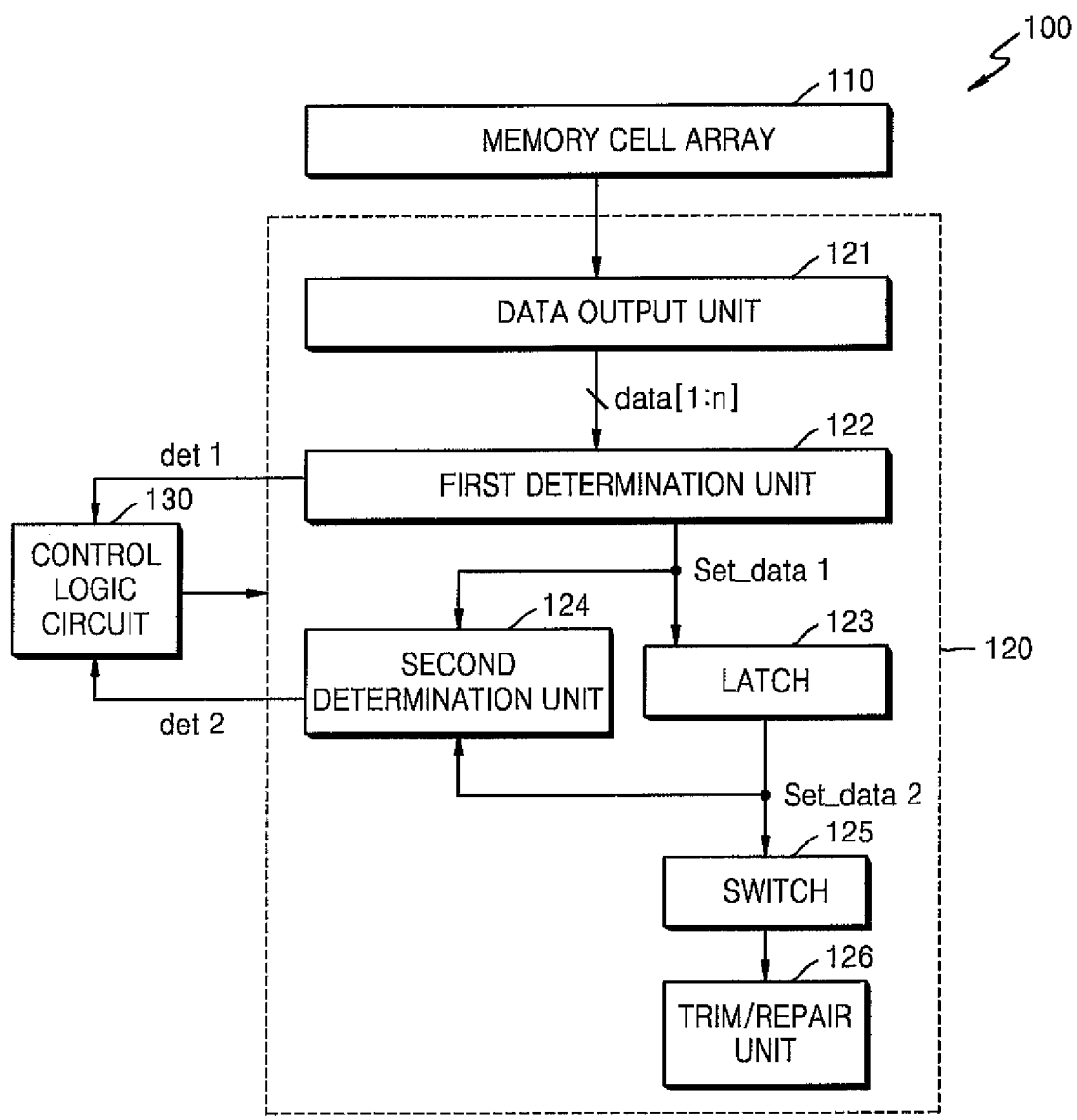
FIG. 2 is a block diagram of a flash memory device, according to an exemplary embodiment of the present invention.

FIG. 2 is a block diagram of a flash memory device 100, according to an illustrative embodiment of the present invention. Referring to FIG. 2, the flash memory device 100 includes a memory cell array 110, a peripheral circuit 120 for programming, reading and performing other operations on the memory cell array 110, and a control logic unit 130 for controlling operation of the flash memory device 100.

The flash memory device 100 employs an Electrical fuse (E-fuse) method and stores set information regarding operating environment settings in the memory cell array 110. For example, the set information may include DC trim information, option information, repair information and bad block information. When power is applied to the flash memory device 100, an initial read operation is performed on the memory cell array 110 in which the set information is stored. The set information read in the initial read operation is stored in a predetermined latch (e.g., latch 123), as discussed below. Thus, the operating environment of the flash memory device 100 is set based on the set information.

The set information read from the memory cell array 110 and stored in the latch 123 should be reliable and valid. Accordingly, the flash memory device 100, according to embodiments of the present invention, may include a determination unit (e.g., first determination unit 122) that receives the set information read from the memory cell array 110, determines the status of the received set information, and passes or fails the initial read operation based on the determination. Furthermore, the flash memory device 100 includes another determination unit (e.g., second determination unit 124) that compares set information provided to the latch 123 to set information output from the latch 123, and determines whether the set information is normally stored in the latch 123 on the basis of the comparison.

In other words, the status of the set information read from the memory cell array 110 is judged to determine whether the initial read operation has passed or failed. Set information that is judged to be valid data is stored in the latch. It is then determined whether the set information has been normally or properly stored in the latch, which improves reliability of the set information stored in the latch.

More particularly, the peripheral circuit 120 illustrated in FIG. 2 includes a data output unit 121, the first determination unit 122, the latch 123, the second determination unit 124, a switch 125 and a trim/repair unit 126. The trim/repair unit 126 may be a trim circuit or a repair circuit. The trim/repair unit 126 sets various DC levels using the set information stored in the memory cell array 110 when the trim/repair unit 126 is a trim circuit, and repairs column defects and/or block defects when the trim/repair unit 126 is a repair circuit.

When power is applied to the flash memory device 100, an initial read operation is performed to read the set information used to set an operating environment of the flash memory device 100. The set information is previously stored in the memory cell array 110. The read set information is provided to the data output unit 121, which controls the output of the set information. As such, the data output unit 121 may include a page buffer (not shown) and an input/output buffer (not shown).

The set information read from the memory cell array 110 is provided to the first determination unit 122 via the data output unit 121. The first determination unit 122 receives the read set information and judges the status of the set information. The first determination unit 121 determines whether the initial read operation has passed or failed based on the judgment result, and generates a first determination signal det1 according to the determination result. Operation of the first determination unit 122 is explained in more detail, below.

The set information includes at least one bit. Each bit of the set information may be extended to n bits (where n is an integer equal to or greater than 2) and stored in the memory cell array 110. For example, one bit included in the set information may be extended to eight bits and then stored in the memory cell array 110. That is, a bit of "1" is extended to "11111111" and stored in the memory cell array 110, and a bit of "0" is extended to "00000000" and stored in the memory cell array 110.

The memory cell array 110 may be divided into one or more domains. Each domain may consist of multiple input/output regions from which data bits are simultaneously output according to a single address. For example, if the memory cell array 110 includes m input/output regions (where m is an integer equal to or greater than n) from which data bits are simultaneously output according to a single address, the extended n bits [1:n] of the set information are respectively stored in n input/output regions from among the m input/output regions.

The first determination unit 122 receives the extended n bits [1:n] that are simultaneously output according to a single address, and judges the status of the received n bits [1:n] to determine whether the initial read operation has passed or failed. The first determination unit 122 outputs the first determination signal det1 according to the determination result.

More specifically, the first determination unit 122 judges the status of the received n bits [1:n] and determines whether the number of "1" bits or "0" bits from among the n bits is greater than (or equal to) a predetermined reference value. For example, when a bit of "1" of the set information is extended to "11111111" and stored in the memory cell array 110, and the reference value is seven, the first determination unit 122 determines that the initial read operation has passed. Accordingly, it outputs a first determination signal det1 according to the determination result when the number of "1" bits (or "0" bits) from among the n bits is greater than seven. Accordingly, even when a column defect is generated in "11111111," and thus one of the eight bits is read as "0," for example, the first determination unit 122 still determines that the initial read operation has passed because the remaining number of "1" bits is seven.

If both the number of "1" bits and the number of "0" bits in the eight bits are equal to or less than 6, the first determination unit 122 determines that the initial read operation has failed and outputs a first determination signal det1 indicating this determination result. To make its determination, the first determination unit 122 may include a counter (not shown), which counts the number of "1" bits and/or "0" bits.

The control logic unit 130 controls operation of the flash memory device 100, in part, according to the first determination signal det1 of the first determination unit 122. When the first determination signal det1 indicates that the initial read operation has passed, the control logic unit 130 controls the first determination unit 122 to output a 1-bit set data signal Set_data1 in response to the n bits input to the first determination unit 122. As illustrated in the example illustrated in FIG. 2, the set data signal Set_data1 may be directly output from the first determination unit 122 to the latch 123, as well as the second determination unit 124. It is understood, however, that the transfer of the set data signal Set_data1 is not limited to this configuration. For example, the control logic unit 130 may output the set data signal Set_data1 to the latch 123 and/or the second determination unit 124, when it is determined that the initial read operation has passed, based on the first determination signal det1.

When it is determined that the initial read operation has failed, the control logic unit 130 controls the peripheral circuit 120 to re-read the set information. For example, for a read operation of the flash memory device 100, a voltage applied to the flash memory device 100 must be sufficiently increased to reach a read level. However, the initial read operation of the flash memory device 100 may occur even if the voltage has not been sufficiently increased to the read level. Accordingly, the initial read operation of the flash memory device 100 is prevented from being performed when the voltage is not sufficiently increased to the read level in order to generate an error by re-reading the set information.

A first maximum loop value corresponding to a predetermined integer can be set in the control logic unit 130 for controlling the number of times the set information may be re-read. For example, the control logic unit 130 may control the re-reading operation to be repeated a number of times less than the first maximum loop value, if the initial read operation fails.

In an embodiment, the first determination unit 122 can determine whether the number of "1" bits or the number of "0" bits in the extended n bits [1:n] is greater. The first determination unit 122 then respectively outputs "1" or "0" as the set data signal Set_data1 when the number of "1" bits or "0" bits of the extended n bits [1:n] is greater. For example, when it is determined that the number of "1" bits is greater than the number of "0" bits, "1" is output as the set data signal Set_data1 to the latch 123. A logic circuit configuration capable of determining a set data signal based on a majority of data bits would be apparent one skilled in the art, so a detailed explanation thereof is not included.

The set data signal Set_data1, reflecting a judgment by the first determination unit 122 that the set information is valid, is provided to the latch 123. The set information may be determined by combining the set data signals. The set information stored in the latch 123 is provided to the switch 125, which controls the trim/repair unit 126 according to a switching state of the switch 125.

To determine whether the set information has been normally stored in the latch 123, the set data signal Set_data1 provided to the latch 123 by the first determination unit 122 and a set data signal Set_data2 output from the latch 123 are transferred to the second determination unit 124. The second determination unit 124 compares the set data signal Set_data1 and the set data signal Set_data2 to determine whether the set information has been normally stored in the latch 123. Specifically, the second determination unit 124 determines whether the set data signal Set_data1 input to the latch 123 from the determination unit 122 is identical to the set data signal set_data2 output from the latch 123, and provides a det2 signal indicating the determination result to the control logic unit 130.

When the set data signal Set_data1 is identical to the set data signal Set_data2, the set data signal Set_data1 is finally stored in the latch 123 as the set data, and a next data comparison operation is carried out. When the set data signal Set_data1 is different from the set data signal Set_data2, the control logic unit 130 controls the set data signal Set_data1 to be again provided to and re-stored in the latch 123. To re-store the set data signal Set_data1 in the latch 123, a second maximum loop value corresponding to a predetermined integer is set in the control logic unit 130. The control logic unit 130 controls the re-storing operation to be repeated up to a number of times less than the second maximum loop value, when it is determined that the data storing operation has failed.

In an embodiment, when it is determined that the set data signal Set_data1 is different from the set data signal Set_data2, and thus that the data storing operation has failed, the control logic unit 130 controls the flash memory device 100 to re-read the set information. That is, if an error has been generated when the set data signal Set_data1 is stored in the latch 123, the set information can be re-read to prevent again generating the error.

Figure 3:
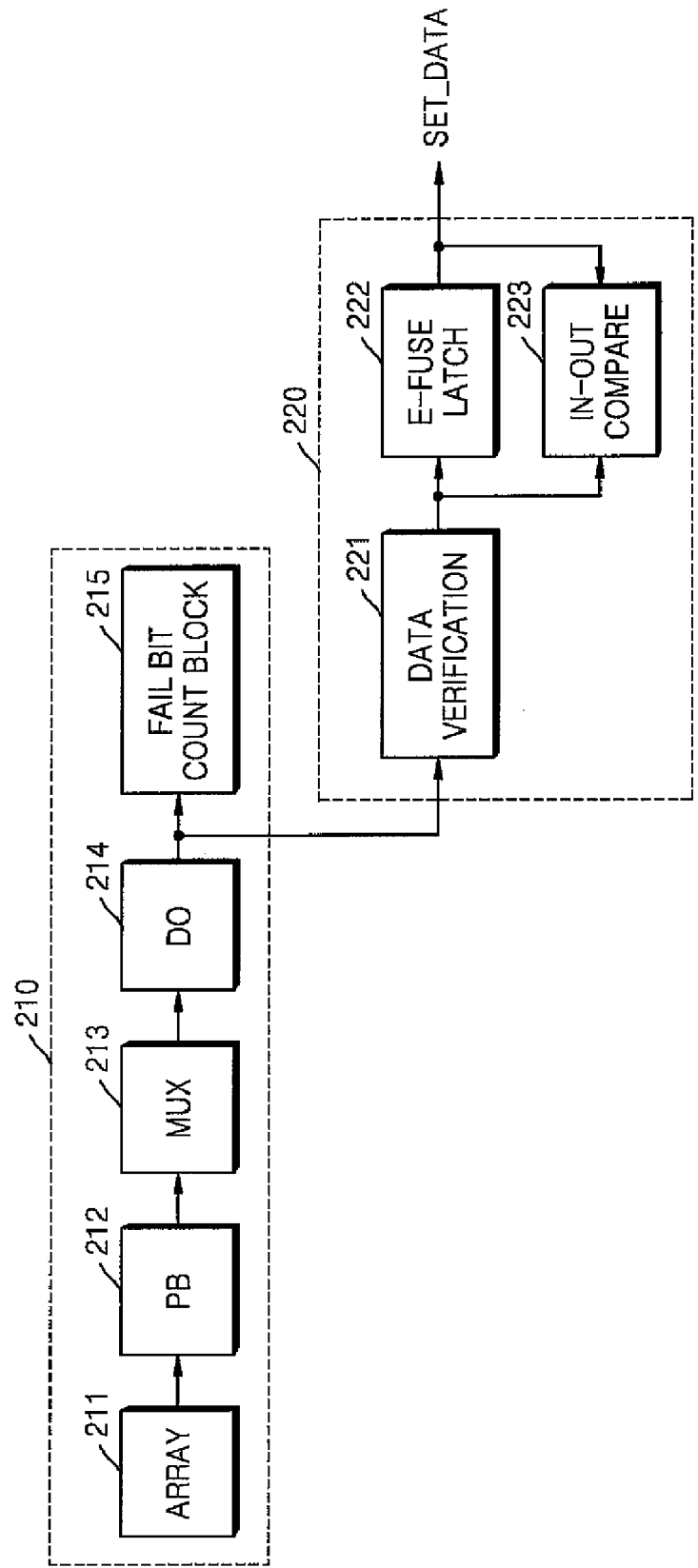
FIG. 3 is a block diagram illustrating a set information transfer path, according to an exemplary embodiment of the present invention.

FIG. 3 is a block diagram illustrating a set information transfer path, according to an illustrative embodiment of the present invention. Referring to FIG. 3, a test performed while manufacturing the memory device involves a process illustrated in a block 210.

More particularly, set information stored in a memory cell array 211 is read and provided to a page buffer 212. The set information provided to the page buffer 212 is transferred to an input/output block 214 via a multiplexer 213, according to a predetermined address. A predetermined test apparatus receives the output of the input/output block 214. A fail bit count block 215 included in the test apparatus compares the output of the input/output block 214 to the original set information and counts the number of failed bits. The status of the set information can be verified through this process. The fail bit count block 215 can be included in the memory device and/or in an external test apparatus, as illustrated in FIG. 3.

The operating conditions of the memory device are set using the set information stored in the memory cell array 211. In a conventional flash memory device, the path of the set information is indirectly verified through DC and/or C/R repair and measurement of a bad block after the operating conditions have been set. Therefore, the path of the set information cannot be accurately verified.

In the depicted embodiment, first and second determination operations are performed in order to verify the set information path. Specifically, the output of the input/output block 214 is provided to a data verification block 221 that performs the first determination operation. That is, the data verification block 221 receives the extended n bits [1:n], judges the status of the n bits and outputs a single set data bit. The set data bit is provided to an E-fuse latch 222 for storing the set information. An in-out compare block 223 performs the second determination operation by comparing the data input to the E-fuse latch 222 and data output from the E-fuse latch 222. The first and second determination operations can be applied to a process of testing the memory device. Furthermore, the first and second determination operations can be applied to a process of determining whether the set information is properly read and stored in the latch when a memory device operating environment is set.

The first determination operation will now be explained in detail with reference to FIGS. 4, 5, 6 and 7.

Figure 4:
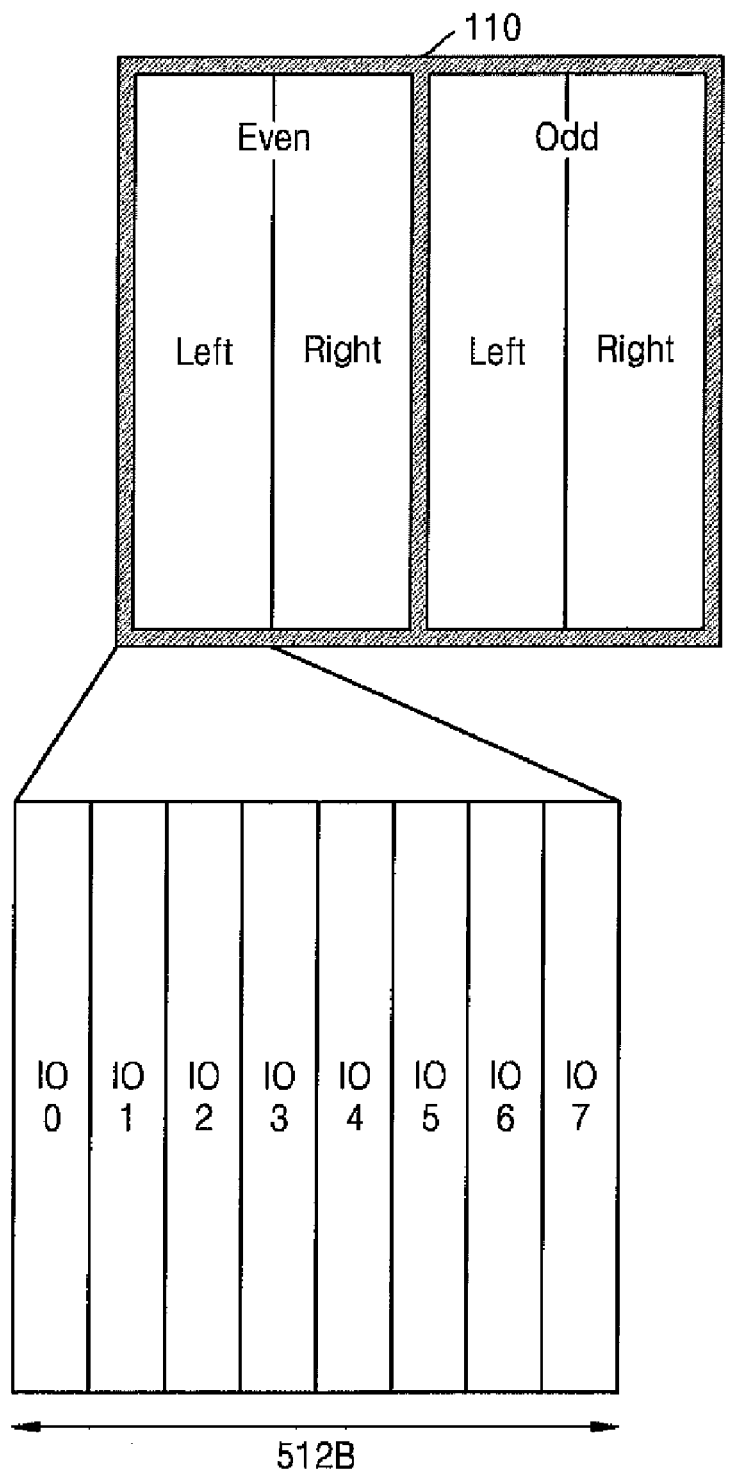
FIG. 4 illustrates a structure of a memory cell array included in the flash memory device illustrated in FIG. 2, according to an exemplary embodiment of the present invention.

FIG. 4 illustrates a structure of the memory cell array 110 included in the flash memory device 100 illustrated in FIG. 2, according to an illustrative embodiment of the present invention. The memory cell array 110 included in the flash memory device 100 can be divided into an even region and an odd region for an interleaving operation. Each of the even region and the odd region can be divided into a left part and a right part. When each page of the memory cell array 110 has 2 Kbytes, the left part and the right part of each region respectively have 512 bytes. For example, the left part of the even region can include a column corresponding to eight input/output regions IO0 through IO7. One-bit data is output from each of the eight input/output regions IO0 through IO7 for a single address, and the eight bits respectively output from the eight input/output regions IO0 through IO7 correspond to one byte.

Figure 5:
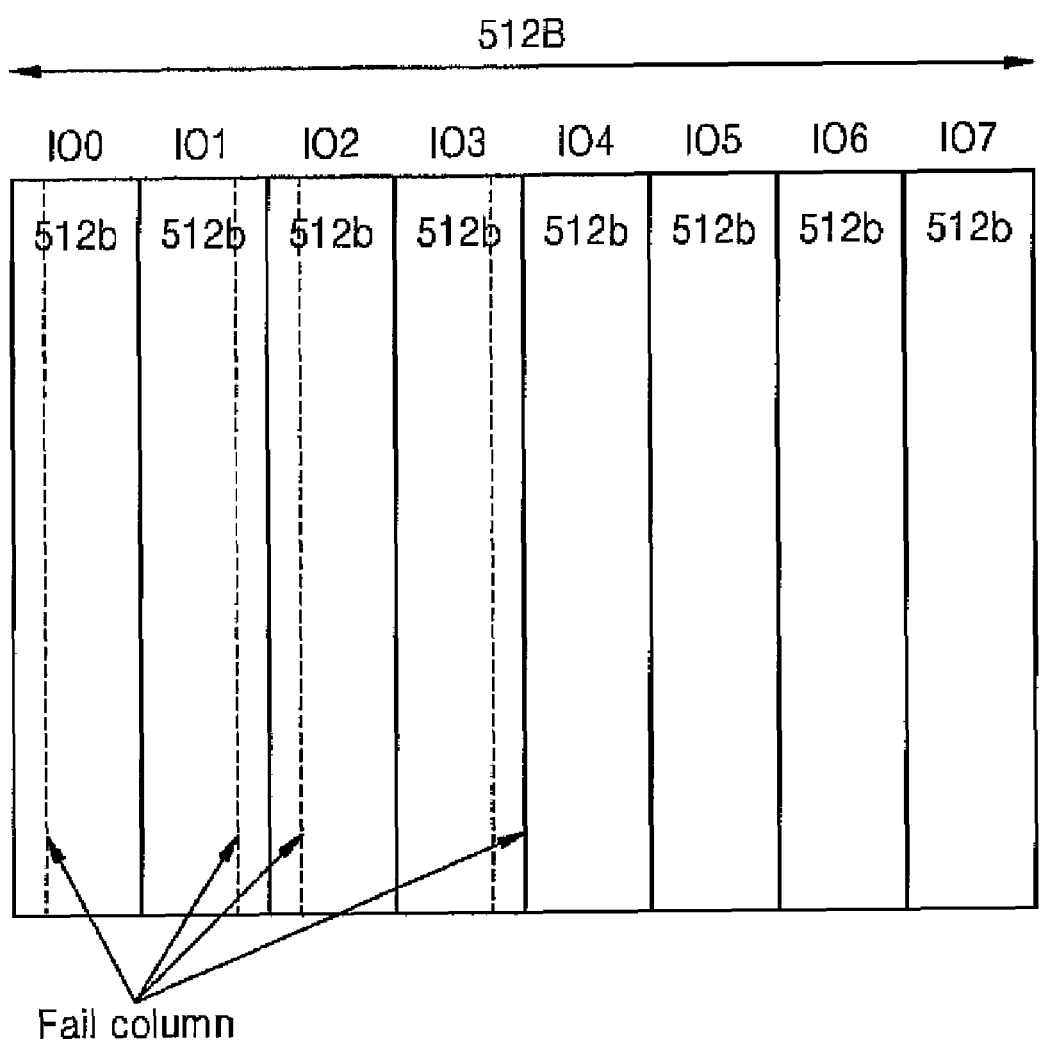
FIG. 5 illustrates column defects generated in the memory cell array in the flash memory device illustrated in FIG. 2, according to an exemplary embodiment of the present invention.

FIG. 5 illustrates column defects generated in the memory cell array 110. Referring to FIG. 5, eight input/output regions IO0 through IO7 correspond to a 512-byte column, and the column defects are randomly located in the eight input/output regions IO0 through IO7. In the depicted example, when the flash memory device 100 is tested, only a defect generated in a single input/output region from among the eight input/output regions IO0 through IO7 corresponding to a single address is allowed. When two or more defects are generated, the flash memory device 100 is determined to be a failed die. When no or only a single input/output region from among the eight input/output regions IO0 through IO7 corresponding to a single address has a defect, the flash memory is determined to be a pass die.

Accordingly, each bit of the set information is extended to n bits [1:n] and stored in the memory cell array 110. Here, the n bits are respectively stored in different input/output regions of the memory cell array 110. For example, extended eight bits are respectively stored in the eight input/output regions IO0 through IO7. In this case, the probability that an error is generated in the extended eight bits is less than one bit in the initial read operation, and the generation of an error can be minimized when the extended bits are read even when progressively generated defects are considered.

Figure 6A:
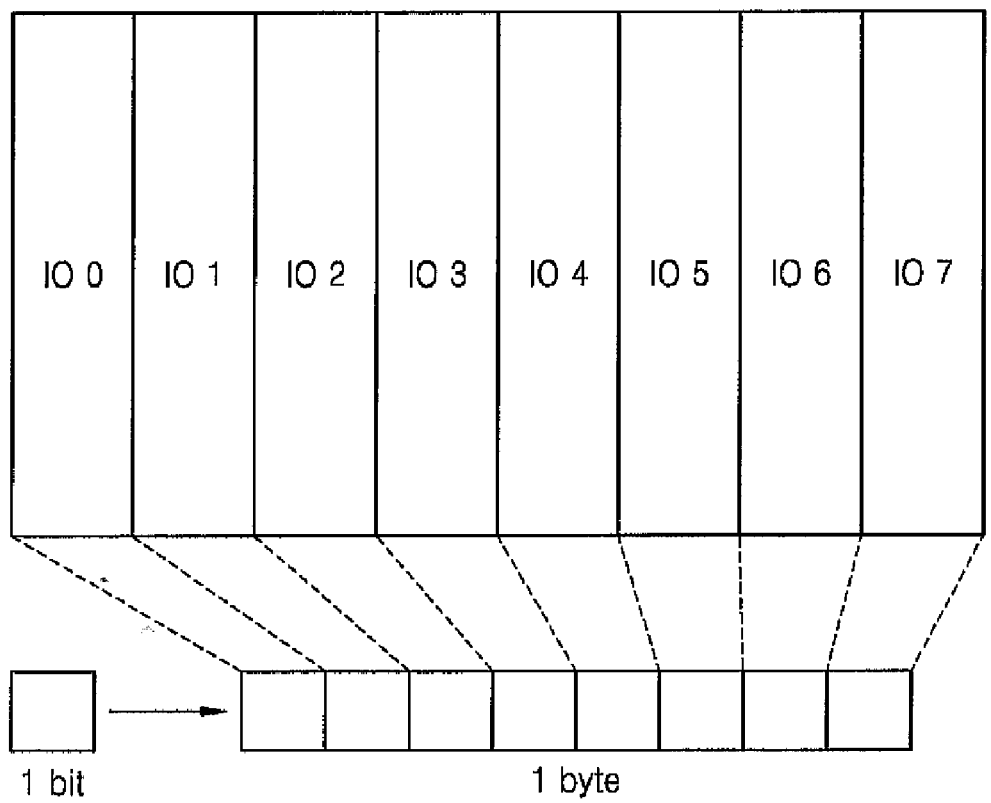
FIGS. 6A and 6B illustrate an extension of bits of set information, according to an exemplary embodiment of the present invention.
Figure 6B:
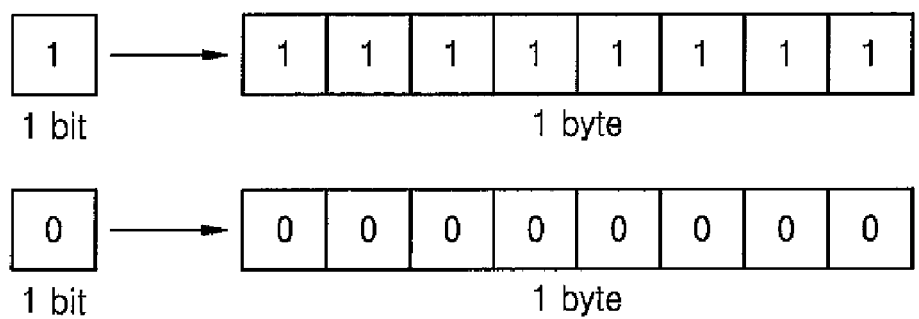

FIGS. 6A and 6B illustrate an extension of each bit of set information, according to an illustrative embodiment of the present invention. Referring to FIG. 6A, the memory cell array 110 includes the eight input/output regions IO0 through IO7 simultaneously outputting data bits according to a single address, and 1-bit set information is extended to 8-bit data and stored in the memory cell array 110. Referring to FIG. 6B, a bit of "1" of the set information is extended to "11111111" and respectively stored in the eight input/output regions IO0 through IO7. A bit of "0" of the set information is extended to "00000000" and respectively stored in the eight input/output regions IO0 through IO7.

The first determination unit 122 receives the set information data [1:n] read in the initial read operation and judges the status of the set information data [1:n]. Specifically, the data determination unit 122 receives the extended 8-bit data, determines that the initial read operation has passed when the number of "1" bits is greater than a reference value, and outputs the first determination signal det1 according to the determination result. In this example, "1" is provided as the set data signal Set_data1 to the latch 123. Thus, an error, e.g., generated due to a column defect when the set information for setting an operating environment is read, can be removed.

Figure 7A:
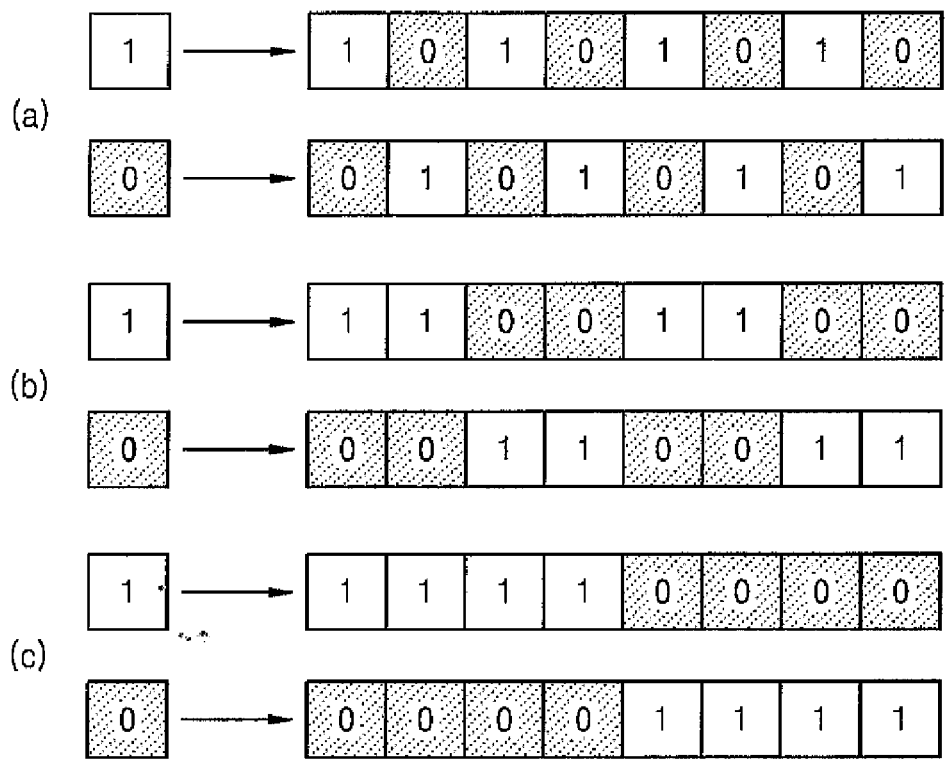
FIG. 7A illustrates an extension of bits of set information, according to another exemplary embodiment of the present invention.
Figure 7B:
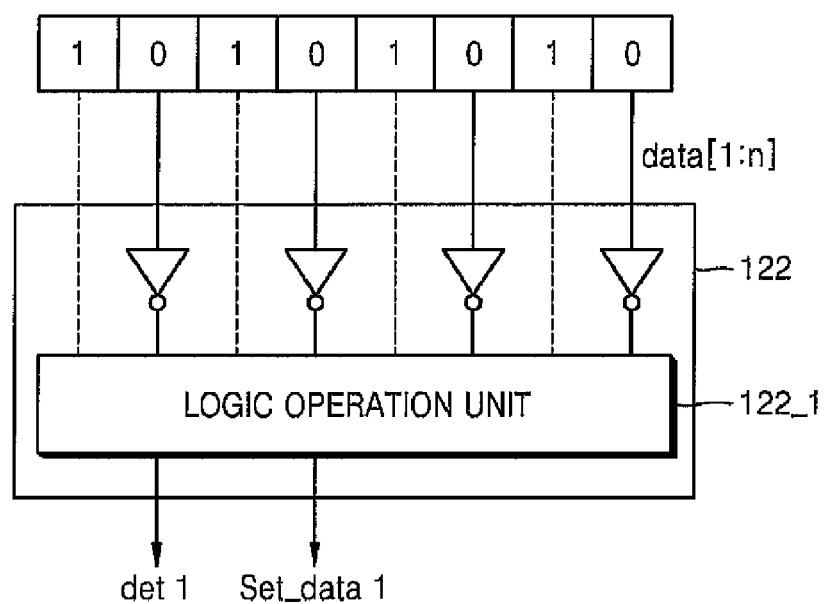
FIG. 7B illustrates a method of determining the status of read set information.

FIG. 7A illustrates an extension of each bit of set information according to another illustrative embodiment of the present invention, and FIG. 7B illustrates a method of determining the status of the read set information.

Referring to FIG. 7A, each bit of the set information is extended to n bits such that the n bits have a combination of "0" bits and "1" bits based on a coding method. FIG. 7A (a) illustrates an example in which a bit of "1" of the set information is coded into eight bits "10101010" and a bit of "0" of the set information is coded into eight bits "01010101." FIG. 7A (b) illustrates an example in which a bit of "1" of the set information is coded into eight bits "11001100" and a bit of "0" of the set information is coded into eight bits "00110011." FIG. 7A (c) illustrates an example in which a bit of "1" of the set information is coded into eight bits "11110000" and a bit of "0" of the set information is coded into eight bits "00001111."

The coded set information data is more reliable than set information data in which each bit extended to n bits having the same value, as described with reference to FIGS. 6A and 6B (e.g., when a bit of "1" is extended to "11111111"). In particular, a problem may arise when a fluctuation occurs, e.g., when powering up or when power applied to the flash memory is not sufficiently increased to a read level, thus generating a data error. In other words, the extended bits may all be changed from "11111111" to "00000000" or from "00000000" to "11111111" in response to the fluctuation and read. It would then be incorrectly determined that the initial read operation has passed because the number of identical bits from among the extended n bits [1:n] is greater than the reference value. Accordingly, the set data would include an error.

The method of extending bits of the set information as illustrated in FIGS. 7A and 7B addresses this potential problem. That is, a bit of "1" and a bit of "0" are extended to bits having a combination of "1s" and "0s" using a coding method. For example, a bit of "1" may be extended to "10101010" and a bit of "0" may be extended to "01010101," as shown in FIG. 7A (a). In this case, when a bit of "1" is wrongly read as "0" or a bit of "0" is wrongly read as "1," e.g., due to the instability of a power level, it can be determined that the initial read operation has failed. Accordingly, it is possible to prevent the generation of an error in the set data.

FIG. 7B illustrates the first determination unit 122 judging the status of the read data when the set information bit is extended according to a coding method. When a "1" bit of the set information is extended to eight bits "10101010," as shown in FIG. 7A (a), and stored in the memory cell array 110, the eight bits read in the initial read operation are provided to the first determination unit 122.

The first determination unit 122 includes a decoder configured to receive n bits (eight bits in the depicted embodiment) extended according to the coding method, and to decode the n bits. The decoder may include at least one inverter for inverting some of the n bits. The n bits decoded by the decoder are provided to a logic operation unit 122_1. The logic operation unit 122_1 determines the number of bits having the same value and/or determines which of the number of "1" bits and the number of "0" bits is greater. Furthermore, the logic operation unit 122_1 generates a pass or fail first determination signal det1, according to the determination result, and generates the set data signal Set_data1 corresponding to the n-bits.

Therefore, even when data bits are changed from "11111111" to "00000000" or changed from "00000000" to "11111111," e.g., due to power fluctuations or an insufficient increase to the read level, the first data determination unit 122 is prevented from incorrectly passing the initial read operation. Also, even when a column defect is generated in the memory cell array 110, as described above, the generation of an error due to the column defect can be prevented. Thus, the reliability of reading the set information is improved.

Figure 8:
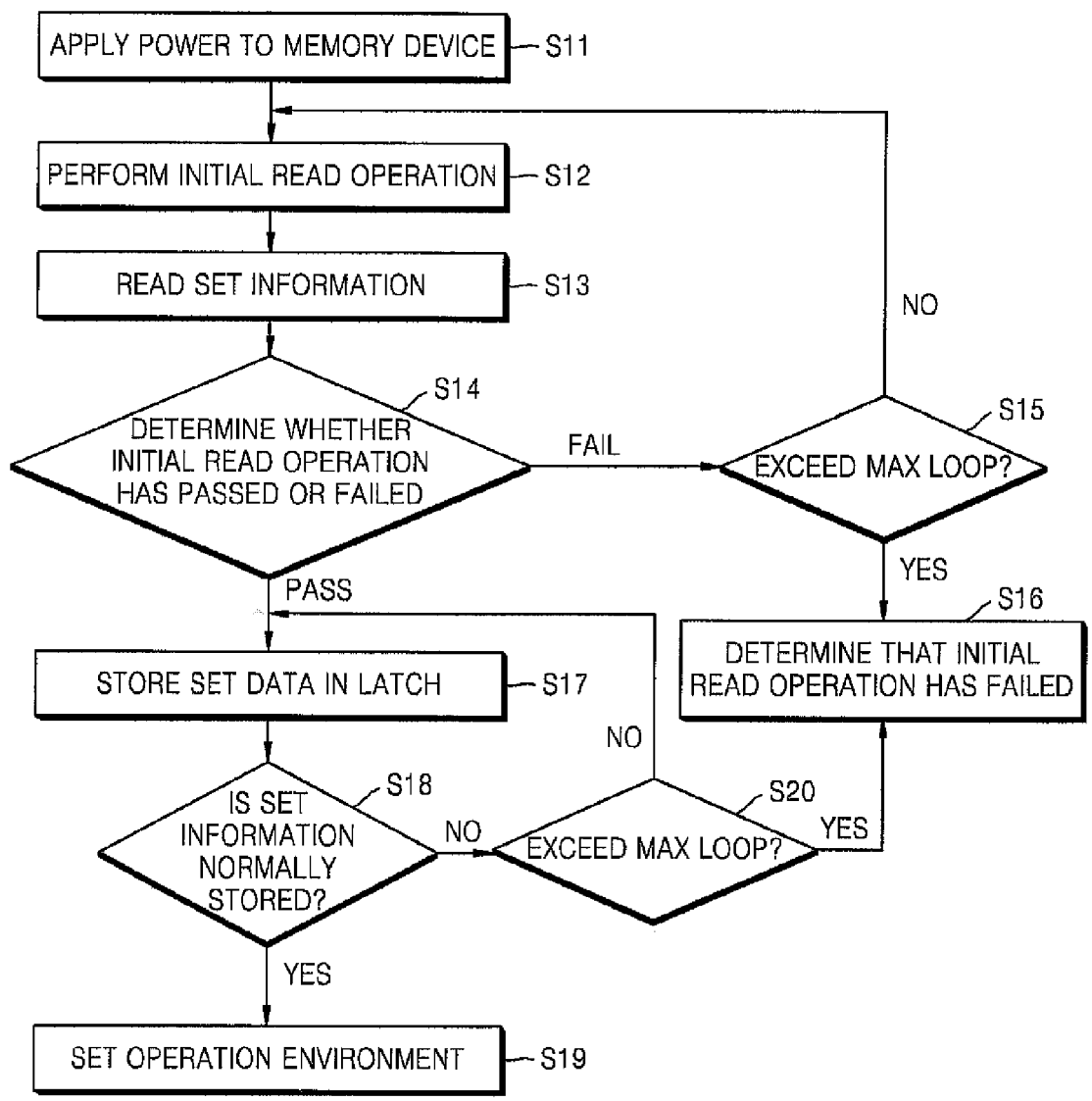
FIG. 8 is a flow chart of a method of driving a flash memory device, according to an exemplary embodiment of the present invention.

FIG. 8 is a flow chart of a method of driving a flash memory device 100, according to an illustrative embodiment of the present invention.

Referring to FIG. 8, power is applied to the flash memory device including a memory cell array in operation S11. The memory cell array has stored set information related to operating environment settings. Each bit of the set information is extended to n bits and stored in the memory cell array. For example, a bit of "1" of the set information can be extended to eight bits "11111111." Alternatively, each bit of the set information can be extended to bits having coded combinations of "1s" and "0s." The extended bits are respectively stored in different input/output regions in the memory cell array.

When power is applied to the flash memory device, an initial read operation for reading the set information from the memory cell array is performed, in operation S12. The memory cell array includes m input/output regions from which data bits are simultaneously output according to a single address. When extended n bits [1:n] are respectively stored in the m input/output regions, n bits of set information are read in operation S13.

In operation S14, the extended n-bit data is provided to a first determination unit, and the status of the extended n-bit data is judged by the first determination unit to determine pivot axis 48 at first pivot joint 40. Preferably, link 32 is stationary, and link 34 pivots thereabout. Second and third links 34 and 36 pivot relative to each other about a second pivot axis 50 at second pivot joint 42. Third and fourth links 36 and 38 pivot relative to each other about a third pivot axis 52 at third pivot joint 44. Fourth and first links 38 and 32 pivot relative to each other about a fourth pivot axis 54 at fourth pivot joint 46. As noted, it is preferred that link 32 is stationary, and link 38 pivots thereabout. whether the initial read operation has passed or failed. As previously described, the first data determination unit determines whether the number of "1" bits or "0" bits from among the n bits is greater than a predetermined reference value. The first data determination unit determines that the initial read operation has passed when the number of "1" bits or "0" bits is greater than the reference value, and determines that the initial read operation has failed when the number of "1" bits or "0" bits is less than the reference value. Alternatively, the first data determination unit may determine which of the number of "1" bits and the number of "0" bits is greater in number to judge the status of the n-bit data.

When it is determined that the initial read operation has failed in operation S14, the set information may be re-read, depending on the number of previous failures. A first maximum loop value corresponding to a predetermined integer is set in the flash memory device, and it is determined whether the number of operations of reading the set information exceeds the first maximum loop value in operation S15. When the number of operations of reading the set information does not exceed the first maximum loop value, the set information is re-read by repeating operations S12, S13 and S14. When the number of re-reading operations exceeds the first maximum loop value, it is determined that the flash memory device has failed in operation S16.

When it is determined that the initial read operation has passed at operation S14, the set data is latched in a predetermined latch in operation S17. Here, a "1" or "0" is latched as the set data according to the status of the corresponding n-bit data. For example, when the number of "1" bits in the eight bits is greater than 7, "1" is latched as the set data.

In operation S18, it is determined whether the set information is normally stored in the latch. Specifically, it is determined whether data input to the latch is identical to data output from the latch in operation S18. When the data input to the latch is identical to the data output from the latch, it is determined that the set information is normally stored in the latch. An operating environment of the memory device is then set using the set information stored in the latch in operation S19.

When the data input to the latch is different from the data output from the latch, the set data may be stored in the latch again, depending on the number of previous failures. Specifically, a second maximum loop value corresponding to a predetermined integer is set in the memory device and it is determined in operation S20 whether the number of operations of re-storing the set data in the latch exceeds the second maximum loop value. When the number of operations does not exceed the second maximum loop value, the set data is stored in the latch again, and thus, operations S17 and S18 are repeated. When the number of operations exceeds the second maximum loop value, it can be determined that the memory device has failed in operation S16.

Figure 9:
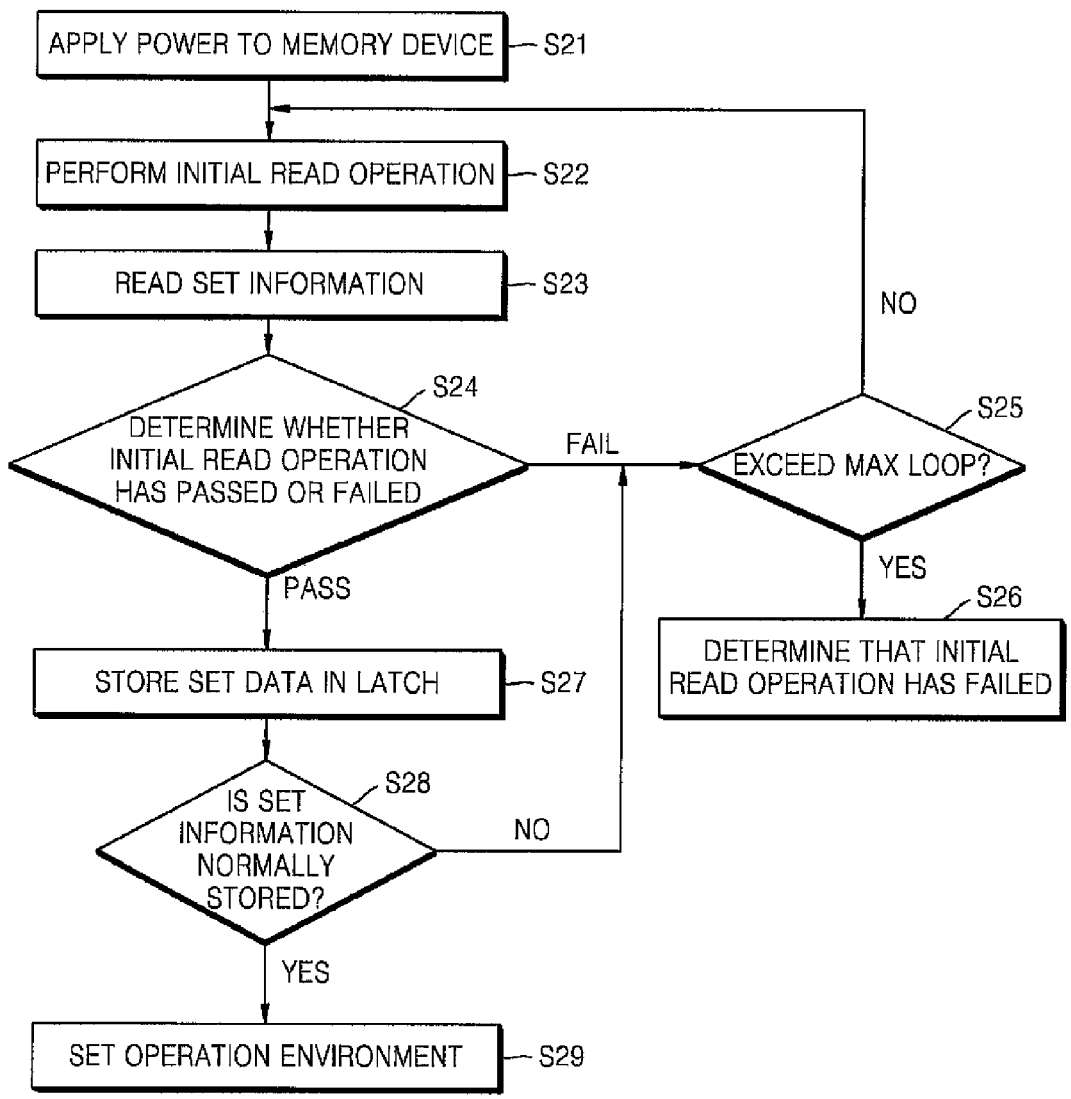
FIG. 9 is a flow chart of a method of driving a flash memory device, according to another exemplary embodiment of the present invention.

FIG. 9 is a flow chart illustrating a method of driving the flash memory device 100, according to another illustrative embodiment of the present invention.

Referring to FIG. 9, power is applied to the flash memory device including a memory cell array in operation S21, and an initial read operation for reading set information from the memory cell array is performed in operation S22. The set information is read in operation S23, and the status of n bits extended from each bit of the set information is judged in operation S24.

When it is judged that the initial read operation has failed, it is determined whether the number of operations of reading the set information exceeds a predetermined maximum loop value in operation S25. When the number of operations does not exceed the maximum loop value, the set information is re-read, and operations S22, S23 and S24 are repeated. When the number of operations exceeds the maximum loop value, it is determined that the memory device has failed in operation S26.

When it is determined in operation S24 that the initial read operation has passed, set data is stored in a predetermined latch in operation S27. Then, it is determined whether the set information is normally stored in the latch in operation S28. Specifically, it is determined whether data input to the latch is the same as data output from the latch. When the data input to the latch is identical to the data output from the latch, it is determined that the set information is normally stored in the latch. Then, an operating environment of the memory device is set using the set information stored in the latch in operation S29.

When it is determined in operation S28 that the data input to the latch is different from the data output from the latch, the set information may be re-read, depending on the number of previous failures. In the depicted embodiment, though, the determination is made based on the maximum loop value, as opposed to a second maximum loop value. When the number of operations of reading the set information does not exceed the predetermined maximum loop value in operation S25, the set information is re-read and operations S22 through S28 may be repeated. In an alternative embodiment, only operations S27 and S28 are repeated when the number of operations does not exceed the predetermined maximum loop value in operation S25. When the number of operations exceeds the maximum loop value, it can be determined that the memory device has failed in operation S26.

As described above, according to embodiments the present invention, the reliability of set information ultimately stored in a latch is improved by verifying both the operation of reading the set information and the operation of storing the set information in the latch. The set information stored in the latch is provided to various control circuits included in the memory device to set the operating environment of the memory device.

While the present invention has been particularly shown and described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A method of driving a flash memory device, comprising:
applying power to the flash memory device, the flash memory device including a memory cell array for storing set information used to set an operating environment of the flash memory device;
performing an initial read operation of the memory cell array;
storing the set information read in the initial read operation in a latch; and
determining whether the set information is normally stored in the latch based on set data input to the latch and set data output from the latch.

2. The method of claim 1, wherein determining whether the set information is normally stored in the latch comprises determining whether the set data input to the latch is identical to the set data output from the latch.

3. The method of claim 1, further comprising:
setting the operating environment of the flash memory device using the set information normally stored in the latch.

4. The method of claim 1, further comprising:
repeating the storing of the set information in the latch when it is determined that the set information is not normally stored in the latch.

5. The method of claim 1, further comprising:
repeating the performing of the initial read operation when it is determined that the set information is not normally stored in the latch.

6. A method of driving a flash memory device, comprising:
applying power to the flash memory device, the flash memory device comprising a memory cell array for storing set information used to set an operating environment of the flash memory device;
performing an initial read operation on the memory cell array;
performing a first determination operation that judges a status of data read in the initial read operation and determines whether the initial read operation has passed or failed based on the status;
storing the data in a latch when the initial read operation is determined to have passed; and
performing a second determination operation that determines whether the data is normally stored in the latch based on comparing data input to the latch and data output from the latch.

7. The method of claim 6, wherein the set information comprises at least one bit, each bit of the set information being extended to n bits (where n is an integer greater than or equal to 2), and the n bits are respectively stored in different input/output regions in the memory cell array.

8. The method of claim 7, wherein performing the first determination operation comprises judging a status of the extended n bits to determine whether the initial read operation has passed or failed.

9. The method of claim 7, wherein each bit of the set information is extended such that the n bits comprise a combination of "0" bits and "1" bits using a coding method.

10. The method of claim 9, wherein performing of the first determination operation comprises decoding the n bits by inverting at least one bit among the extended n bits and judging a status of the decoded n bits to determine whether the initial read operation has passed or failed.

11. The method of claim 6, further comprising:
re-reading the set information when it is determined that the initial read operation has failed in the first determination operation.

12. The method of claim 6, wherein performing the second determination operation comprises determining whether data input to the latch is identical to data output from the latch.

13. The method of claim 6, wherein the operating environment of the flash memory device is set using data that is judged to have passed in both the first determination operation and the second determination operation.

14. A flash memory device comprising:
a memory cell array for storing set information used to set an operating environment;
a latch for storing the set information read from the memory cell array in an initial read operation performed when power is applied to the flash memory device;
a data determination unit for determining whether the set information is normally stored in the latch by comparing data input to the latch and data output from the latch; and
a control logic unit for controlling operation of the flash memory device according to the determination result of the data determination unit.

15. The flash memory device of claim 14, wherein the data determination unit determines whether the data input to the latch is identical to the data output from the latch.

16. The flash memory device of claim 14, wherein the control logic unit controls the latch to re-store the set information read from the memory cell array when it is determined that the set information is not normally stored in the latch.

17. The flash memory device of claim 14, wherein the control logic unit controls the initial read operation to be re-executed when it is determined that the set information is not normally stored in the latch.

18. A flash memory device comprising:
a memory cell array for storing set information to set an operating environment of the flash memory device and comprising a plurality of input/output regions from which data is output according to a single address;
a first determination unit for receiving data corresponding to the set information read in an initial read operation performed when power is applied to the flash memory device and for determining whether the received data is valid;
a latch for storing data judged to be valid by the first determination unit;
a second determination unit for determining whether the data is normally stored in the latch based on a comparison of the data provided to the latch and data stored in the latch; and
a control logic unit for controlling the operation of the flash memory device according to the determination results of the first and second determination unit.

19. The flash memory device of claim 18, wherein the set information comprises at least one bit, each bit of the set information being extended to n bits (where n is an integer equal to or greater than 2), and the n bits are respectively stored in different input/output regions of the plurality of input/output regions in the memory cell array.

20. The flash memory device of claim 19, wherein the first determination unit judges the status of the extended n bits to determine whether the initial read operation has passed or failed.

21. The flash memory device of claim 19, wherein each bit of the set information is extended such that the n bits have a combination of "0" bits and "1" bits using a coding method.

22. The flash memory device of claim 21, wherein the first determination unit comprises:
a decoder for decoding the n bits; and
a logic operation unit judging the status of the decoded n bits to determine whether the initial read operation has passed or failed.

23. The flash memory device of claim 18, wherein the second determination unit determines whether the data provided to the latch is identical to the stored data output from the latch.

24. The flash memory device of claim 18, wherein the control logic unit controls the data to be re-stored in the latch when the data is determined to be not normally stored in the latch.

25. The flash memory device of claim 18, wherein the control logic unit controls the initial read operation to be re-executed when the data is not normally stored in the latch.

* * * * *